United States Patent [19]

Chantraine et al.

[11] Patent Number: 5,464,653
[45] Date of Patent: Nov. 7, 1995

[54] METHOD FOR INTERCONNECTION OF METAL LAYERS OF THE MULTILAYER NETWORK OF AN ELECTRONIC BOARD, AND THE RESULTANT BOARD

[75] Inventors: Philippe Chantraine, Seine; Marta Zorilla, Fontenay-le-Fleury, both of France

[73] Assignee: Bull S.A., Paris, France

[21] Appl. No.: 628,896

[22] Filed: Dec. 18, 1990

[30] Foreign Application Priority Data

Dec. 21, 1989 [FR] France .................. 89 16956

[51] Int. Cl.⁶ ........................................ B05D 5/12
[52] U.S. Cl. .................. 427/96; 427/97; 427/98; 427/430.1; 427/443.1
[58] Field of Search .............. 427/96, 98, 97, 427/430.1, 443.1

[56] References Cited

U.S. PATENT DOCUMENTS

| | | |
|---|---|---|
| 3,319,317 | 5/1967 | Roche et al. . |
| 3,436,468 | 4/1969 | Haberecht ................. 427/98 |
| 3,436,819 | 4/1969 | Lunine ...................... 427/98 |
| 3,628,999 | 12/1971 | Schneble .................. 427/98 |
| 3,634,602 | 1/1972 | Vom Bruck . |
| 3,672,986 | 6/1972 | Schneble et al. . |
| 3,760,091 | 9/1973 | Cannizzaro ............... 427/98 |
| 4,301,190 | 11/1981 | Feldstein ................... 427/97 |
| 4,367,119 | 1/1983 | Logan ........................ 156/646 |
| 4,525,383 | 6/1985 | Saito ........................... 427/98 |
| 4,575,467 | 3/1986 | Sirinyan .................... 427/304 |
| 4,632,857 | 12/1986 | Mallory ..................... 427/98 |
| 4,634,468 | 1/1987 | Gulla ......................... 427/305 |
| 4,642,160 | 2/1987 | Burgess ..................... 427/97 |
| 4,659,587 | 4/1987 | Imura ........................ 427/97 |
| 4,790,912 | 12/1988 | Holtzman et al. ....... 427/96 |
| 4,888,209 | 12/1989 | Neely ........................ 427/96 |
| 5,132,038 | 7/1992 | Kukanskis et al. ...... 427/96 |

FOREIGN PATENT DOCUMENTS

| | | | |
|---|---|---|---|
| 92601 | 11/1983 | European Pat. Off. ........ 427/98 |
| 435717 | 7/1991 | European Pat. Off. ........ 427/96 |
| 3125730 | 1/1983 | Germany . |
| 8711105 U | 11/1987 | Germany . |
| 13969 | 2/1979 | Japan ............................ 427/97 |

OTHER PUBLICATIONS

Kenichi Ogawa "Method for Manufacturing A Double Sided Printed Circuit Board" English Translation of Japanese Patent 54–13969.
Kirk–Othmer "Encyclopedia of Chemical Technology" 3rd ed, vol. 8 John Wiley & Sons, 1979, pp. 744–746.

*Primary Examiner*—Benjamin Utech
*Attorney, Agent, or Firm*—Kerkam, Stowell, Kondracki & Clarke; Edward J. Kondracki

[57] ABSTRACT

A method for interconnecting a multilayer metal network of an electronic circuit board is provided. In the method, the electronic circuit board is made up of a plurality of superimposed metal layers having an insulating layer disposed therebetween, wherein the material of the insulating layer is substantially inert to a catalytic activation bath and to chemical deposition of metal. A via hole is formed in the board having a first metal layer thereof as its bottom and traversing a second metal layer and using electroless deposition, metal is deposited in the via by growing the metal from the metal layers only.

16 Claims, 2 Drawing Sheets

METHOD FOR INTERCONNECTION OF METAL LAYERS OF THE MULTILAYER NETWORK OF AN ELECTRONIC BOARD, AND THE RESULTANT BOARD

FIELD OF THE INVENTION

The subjects of the invention are a method for interconnecting metal layers of the multilayer network of an electronic board, and the resultant board. An electronic board serves to connect at least one very large-scale integrated circuit, or VLSI circuit. It can be used for interconnecting a plurality of surface-mounted integrated circuits or chips, or simply to support a single integrated circuit placed in a package, for example substituting for the conventional substrate currently known as a "chip carrier".

BACKGROUND OF THE INVENTION

In such a board, the multilayer network is ordinarily supported by a substrate made of an insulating wafer incorporating the distribution planes of the supply potentials of the integrated circuit or circuits. The substrate may be a wafer of fired ceramic, or a wafer made of an organic material, such as plastic. The board may also be simply made of the multilayer network, in which case it takes the form of a flexible board. Then again, the board may be a wafer of semiconductor material incorporating the integrated circuits and covered with a multilayer network for the interconnection of these integrated circuits by the technology known as wafer scale integration, or WSI. In all these boards, the multilayer network is composed of a stack of alternating conductive and insulating layers. In this stack, an insulating layer is pierced with via holes for the electrical connection of the conductive layers with one another. Ordinarily, the conductive layers are made of aluminum or copper, and the insulating layers are presently preferably made of a polymerized material, such as a polyimide.

One problem in the manufacture of the multilayer metal network lies in optimizing the density of the multilayer metal network. The via holes are currently flared, to facilitate the deposition of the upper metal layer. However, the flaring requires precise positioning on each via hole and also requires control of the degree of flaring. Moreover, the flaring necessitates enlarging the conductors, to the detriment of the large scale of integration sought for the conductors in the network. To solve this problem, the via holes are simply cylindrical or prismatic holes. However, the presence of these simple holes presents a second problem, which is to obtain relatively plane layers in order to superimpose a large number of metal layers on one another in the network. This problem is increasingly serious, the thicker the insulating layers. In current boards, the insulating layers may have a thickness of more than 10 micrometers. One solution to the problem is to fill the via holes, at least partially, with a metal material. The filling results in what is currently known as a via. Because of the vias, the deformation in the upper conductive layers is reduced.

A known method of via manufacture comprises chemical (electroless) nickel deposition. The via hole is first put in contact with a catalytic solution, generally based on palladium, to obtain an activated metal surface. The via hole is then plunged into a bath based on dimethyl aminoborane, known by the abbreviation DMAB, which serves as a reducing agent. Polyimides, in particular, prove to be inert to DMAB. This method of chemical deposition of nickel can be used on any activated metal surface.

The best known description of the phenomenon of chemical (electroless) deposition is that by Van Meerakker in an article in the Journal of Applied Electrochemistry, 1981, Vol. 11, pp. 395 ff. The deposition of metal proceeds with the simultaneous reactions of anodic oxidation of the reducing agent and cathodic reduction of the metal. The activation of the metal surface of the substrate that forms the base of a via hole must permit both dehydrogenation of the reducer and desorption of the hydrogen by recombination or oxidation, at a speed sufficient for the metal deposition to occur. The activation is done by treating the metal surface with a catalytic solution, generally made on the basis of palladium. For example, activation done by a moist method comprises putting the insulating layer and its via holes into contact with a solution of palladium chloride ($PdCl2$). In this case, the activation theoretically takes place only on the metal surface at the bottom of each via hole. In the following DMAB bath, the palladium present at the bottom of the via holes collects the nickel. Normally, the surface of the insulating layer is inert to this type of bath. However, experience has shown that nickel nucleation appears on the surface of the insulating layer that has undergone activation. This nucleation creates insulation defects in the finished multilayer network. To avoid these defects, the outer surface of the insulating layer must be protected with a mask that allows only the bottom of the via holes to show.

Another form of catalytic treatment is the conventional method known as the "lift-off" method. This method comprising forming a photoresist mask on the insulating layer in such a way that only the via holes show, then evaporating the palladium in a vacuum. The palladium uniformly covers the bottom of the via holes and their lateral walls as well as the entire surface of the mask. The mask is then eliminated. After the catalytic treatment, the board is plunged into a DMAB bath for chemical deposition of nickel. This deposition forms in the presence of palladium, beginning at all the walls of each via hole.

The two forms of catalytic processing have disadvantages. In the first form described above, the insulating layer must be covered with a photoresist mask that allows only the via holes to show, to avoid nickel nucleation. As for the lift-off method, the mask is normally necessary. The masking method requires several operations, necessitating precise centering on the via holes. Hence the masking is delicate, tedious and expensive. Moreover, it presents a serious problem when the via holes are deep, as is generally the case with interconnection boards. The masking begins with spreading of a photoresist resin, for example by rotating the board. The resin layer fills the via holes and has a relatively plane surface above the insulating layer. In other words, the resin layer has a much greater thickness inside the via holes than outside them. The conditions of insulation of a positive photosensitive resin, or of developing a negative photosensitive resin depend on the thickness of the resin. Hence it proves difficult to obtain a mask limited only to the contour of the via holes and leaving no trace of resin whatever on the walls of the via hole. Furthermore, this operation requires precise centering over each hole. In summary, the masking that is necessary in the conventional methods comprises supplementary tedious, delicate and expensive operations, and does not give satisfactory results.

The "lift-off" method has another disadvantage. Because of the presence of palladium on all the walls of a via hole, the growth of nickel in the via hole proceeds both vertically and laterally. When the via hole has a diameter greater than its depth, the layer of nickel grows in the form of a U and has an indentation. Furthermore, the upper edges of the layer of nickel are raised and form a ring above the surface of the insulating layer. Both the indentation and the ring conflict with the desired leveling.

Additionally, the known methods of manufacture of multilayer metal networks comprise iterative formation of the complete layers desired. An insulating layer is formed over a metal layer and etched to make the via holes there. Next, the via holes are filled to make the vias, and the insulating layer and its vias are covered with another metal layer. These steps are repeated for the upper layers. To increase the scale of integration of the interconnection of the network, it is desirable to superimpose the vias of the network. This is possible if the vias are coplanar with the insulating layer in which they are incorporated. The moist process of chemical deposition of nickel produces relatively coplanar vias. However, each via has an edge, because there is an edge effect in the growth of the nickel in contact with the lateral walls of the via hole. This edge creates a slight indentation on the upper surface of the via. The upper via in a stack will have a more pronounced indentation. Excessively great difference in level, in other words unevenness, has the disadvantage of creating defects in the metal layer. Consequently, in practice it is impossible to superimpose more than two or three thus-formed vias. The superimposition requires very precise centering in all the operations of masking and etching, in order for two vias to be aligned correctly. Moreover, these operations are necessary in the known methods. The method of "lift-off" chemical deposition creates a major depression in wide via holes and makes it practically impossible to form an upper via. The situation is the same for the flared via holes. Currently, the solution used is to stagger the upper via holes. This staggering is often done in a spiral about a vertical line. However, the cross section of this spiral is much greater than that of the via holes, which conflicts with the desired large scale of integration. Furthermore, a spiral having via holes 90° away from one another, for example, means that the fifth via hole will be superimposed on the bottom one and will create an excessive depression. The cross section of the spiral must accordingly be increased, to the detriment of the large scale of integration sought.

OBJECT AND SUMMARY OF THE INVENTION

The invention introduces a method that does not have the disadvantages of the conventional methods for forming a multilayer metal network by chemical deposition.

The method according to the invention for interconnection in a multilayer metal network of an electronic board using chemical metal deposition in a via hole is characterized by depositing at least first and second superimposed metal layers of the multilayer network; making a via hole the bottom of which has the first metal layer and traversing the second metal layer; and performing the chemical deposition in the via hole in order to connect the two metal layers.

The result is an electronic board that includes a multilayer metal network incorporating at least a chemical metal deposition in a via hole, having a metal layer of the multilayer network as its bottom, characterized in that the chemical deposition forms a via which, in the via hole, directly connects at least one other metal layer of the multilayer network.

The characteristics and advantages of the invention will become apparent from the ensuing detailed description of an exemplary embodiment, taken in conjunction with the accompanying drawings.

DESCRIPTION OF THE PREFERRED EMBODIMENT

Figure 1A:
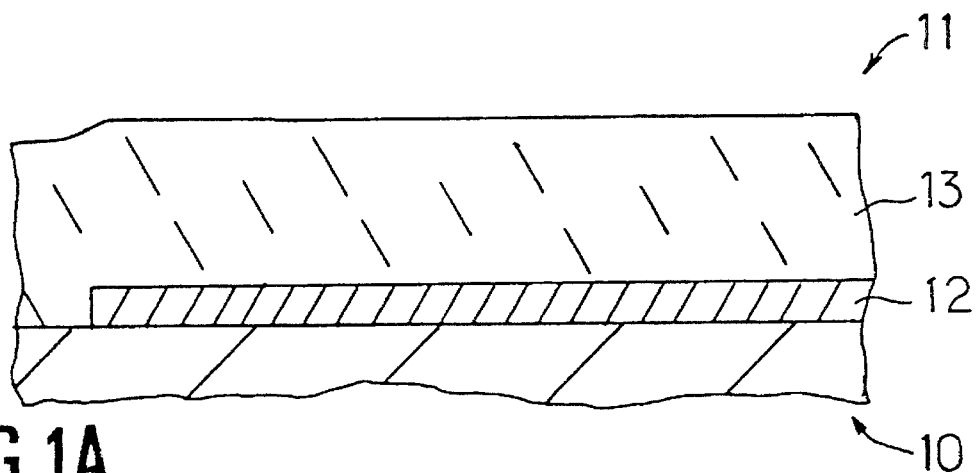
FIGS. 1A, 1B, 1C, 1D, and 1E are schematic, fragmentary sectional views of a board having a multilayer metal network for connection of at least one integrated circuit, illustrating the successive phases of an interconnection method according to the invention.
Figure 1B:
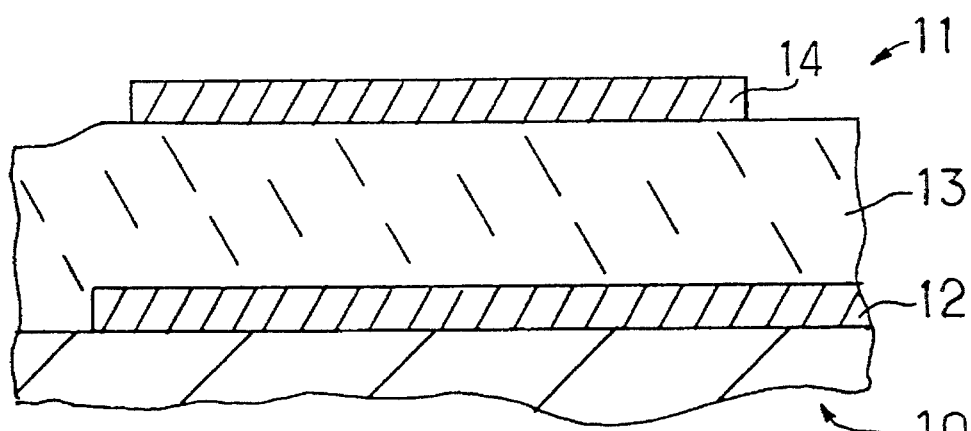
Figure 1C:
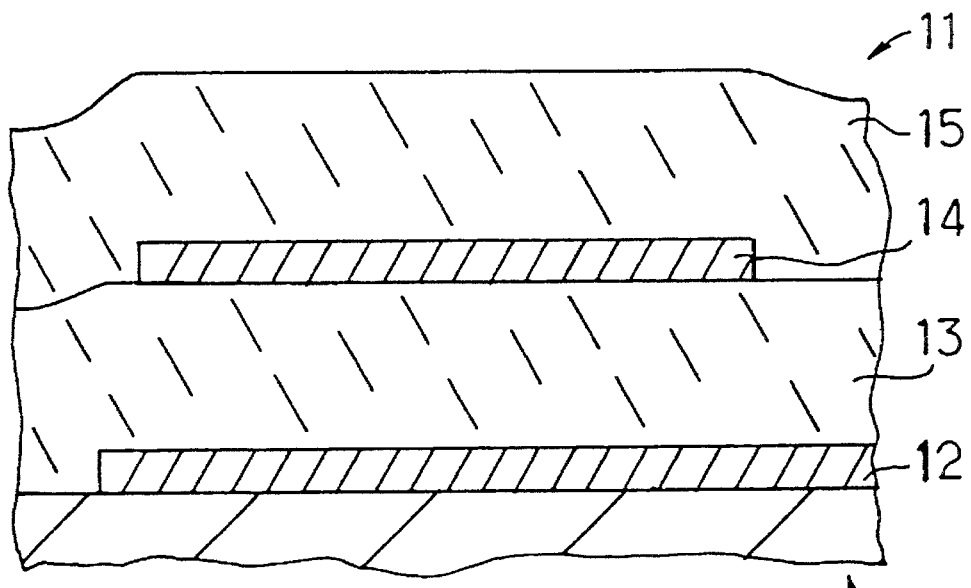
Figure 1D:
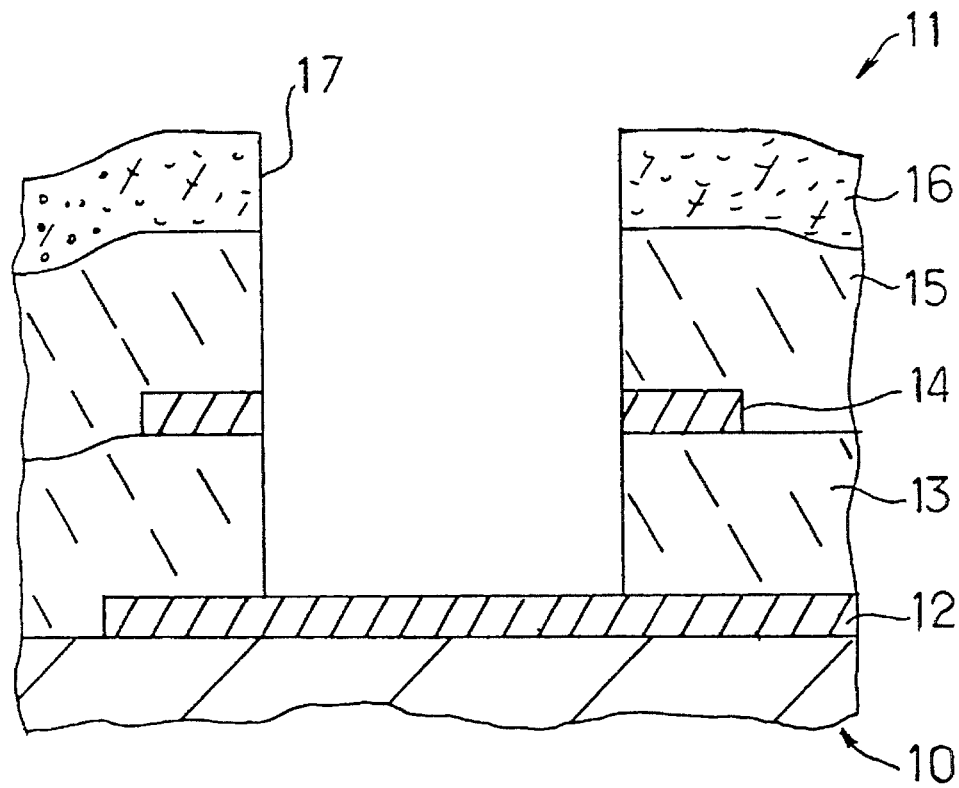
Figure 1E:
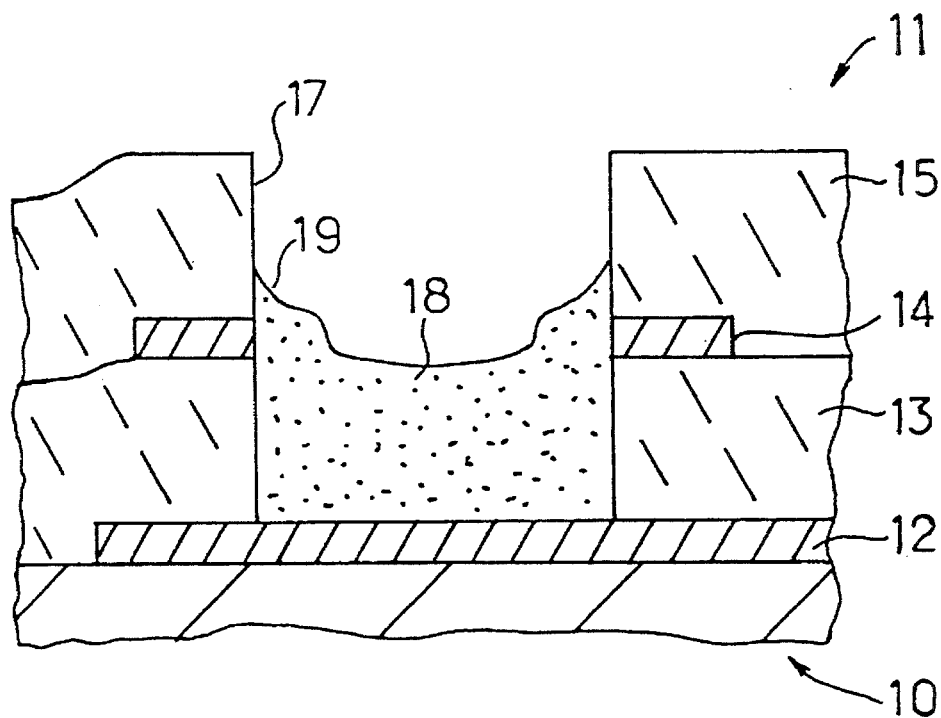

FIGS. 1A–1E show a board 10 having a multilayer metal network 11 for the connection of at least one integrated circuit (not shown). The network 11 is seen in schematic, fragmentary section at the level of a conductor of a metal conductive layer 12. In FIG. 1A, the metal layer 12 is covered uniformly with an insulating layer 13. In FIG. 1A, the intention is to form a via hole and a via that join the conductor of the metal layer 12 with a conductor of an upper metal layer. According to the invention, the conductors of the upper metal layer 14 are formed on the insulating layer 13, as shown in FIG. 1B. The conductors of adjacent metal layers are ordinarily orthogonal, as shown. Next, as shown in FIG. 1C, an upper insulating layer 15 is formed uniformly over the entire upper metal layer 14. In practice, the network 11 was made of electrolytic copper deposited in a film 5 µm in thickness and polyimide deposited in a layer having a thickness on the order of 10 µm. In FIG. 1D, a mineral mask 16 has been formed on the upper insulating layer 15. The mask 16 serves the purpose of successive etching of the subjacent layers 15, 14 and 13, to create a common via hole 17, which has the lower metal layer 12 as its bottom side. In practice, the via holes in the network 11 had a diameter of approximately 40 µm and were spaced apart from one another by at least 125 µm from center to center. Etching of the polyimide was done with plasma, and etching of the copper was done by ion milling. The network 11 shown in FIG. 1D has been activated with a solution of palladium chloride. The board 10 has then been plunged into a bath of DMAB in accordance with the moist method of chemical deposition of nickel. The result is the via 18 shown in FIG. 1E. The palladium deposited on the copper in the via hole 17 causes the nickel to grow vertically from the layer 12, and both vertically and horizontally from the layer 14. The deposition can then be stopped at the level of the via hole 17 shown, in order to have effective, reliable contact between the metal layers 12 and 14. An edge 19 forms at the perimeter of the via hole 17 above the upper layer 14. The edge that is formed centrally below edge 19 is associated with the mass of nickel formed beginning with the layer 12.

Because of the invention, the common via holes 17 can have a cross section substantially equal to or less than its depth and are adapted to any chemical deposition for substantially planar filling. However, particular filling in the shape of a U can create effective and reliable contact between the two copper layers.

Hence the invention is not limited to the example described and shown here. Generally, it can be applied to any metal conductive layer used in a board for connection of integrated circuits, whether copper, gold or in particular aluminum, and for any method for chemical deposition of a filling metal to comprise a via and for the other connection of a plurality of superimposed metal layers. The invention also has the advantage of avoiding the problem of centering of the vias and of successive masking for chemical deposition, and of being suitable for the large scale of connection integration sought. It is understood that any known etching method may be used, for example laser etching. Similarly, the mask may be formed on the upper metal layer. Finally, it will be understood that the linking according to the invention can also be done between two non-adjacent metal layers.

What is claimed is:

1. A method for interconnecting a multilayer metal network of an electronic circuit board comprising:

depositing at least a first and second superimposed metal layers of the multilayer network, said first and second metal layers being separated by a substantially inert insulator layer deposited between said layers;

making a via hole having the first metal layer as its bottom and traversing the second metal layer; and depositing a metal in said via hole to grow said metal from the two metal layers, said insulator layer being substantially inert to said deposition, to form a via stud connecting the two metal layers.

2. The method as defined by claim 1, characterized in that the metal chemically deposited is nickel.

3. The method as defined by claim 2, characterized in that it comprises plunging the board into a bath of Dimethylamine borane.

4. The method as defined by claim 3, characterized in that an activation of the multilayer metal network is performed with a catalytic solution of palladium chloride.

5. The method as defined by claim 3, characterized in that the metal layers are separated from one another by an insulating layer made of a material that is inert to an activation bath.

6. The method as defined by claim 3, characterized in that the via hole has a cross section substantially equal to or less than its depth.

7. The method as defined by claim 2, characterized in that an activation of the multilayer metal network is performed with a catalytic solution of palladium chloride.

8. The method as defined by claim 2, characterized in that the metal layers are separated from one another by an insulating layer made of a material that is inert to an activation bath.

9. The method as defined by claim 2, characterized in that the via hole has a cross section substantially equal to or less than its depth.

10. The method as defined by claim 1, characterized in that an activation of the multilayer network is performed with a catalytic solution of palladium.

11. The method as defined by claim 10, characterized in that the metal layers are separated from one another by an insulating layer made of a material that is inert to an activation bath.

12. The method as defined by claim 10, characterized in that the via hole has a cross section substantially equal to or less than its depth.

13. The method as defined by claim 1, characterized in that the metal layers are separated from one another by an insulating layer made of a material that is inert to an activation bath.

14. The method as defined by claim 13, characterized in that the insulating layer is made of a polymerized material.

15. The method as defined by claim 14, wherein said polymerized material is polyimide.

16. The method as defined by claim 1, characterized in that the via hole has a cross section substantially equal to or less than its depth.

* * * * *